(12) United States Patent
Nagashima et al.

(10) Patent No.: US 6,962,648 B2
(45) Date of Patent: Nov. 8, 2005

(54) BACK-BIASED FACE TARGET SPUTTERING

(75) Inventors: Makoto Nagashima, Tokyo (JP);
Dominik Schmidt, Stanford, CA (US)

(73) Assignee: Global Silicon Net Corp., Fremont, CA (US)

( * ) Notice: Subject to any disclaimer, the term of this patent is extended or adjusted under 35 U.S.C. 154(b) by 0 days.

(21) Appl. No.: 10/662,862

(22) Filed: Sep. 15, 2003

(65) Prior Publication Data

US 2005/0056534 A1    Mar. 17, 2005

(51) Int. Cl.$^7$ .............................................. C23C 14/35
(52) U.S. Cl. ...................... 204/192.12; 204/298.06; 204/298.16; 204/298.23
(58) Field of Search ............... 204/298.06, 298.16, 204/298.23, 192.12

(56) References Cited

U.S. PATENT DOCUMENTS

| | | | |
|---|---|---|---|
| 4,880,515 A | 11/1989 | Yoshikawa et al. .... | 204/192.12 |
| 5,000,834 A | 3/1991 | Yoshikawa ............. | 204/298.08 |
| 5,122,252 A | 6/1992 | Latz et al. ............. | 204/298.26 |
| 5,334,302 A | 8/1994 | Kubo et al. ............ | 204/298.18 |
| 5,415,754 A * | 5/1995 | Manley ................. | 204/192.12 |
| 6,342,133 B2 | 1/2002 | D'Couto et al. ....... | 204/192.17 |
| 6,482,329 B1 * | 11/2002 | Takahashi et al. ............ | 216/22 |
| 2001/0013470 A1 | 8/2001 | Hirata et al. .......... | 204/298.18 |
| 2002/0074225 A1 | 6/2002 | Shi et al. ............... | 204/298.09 |

* cited by examiner

Primary Examiner—Steven Versteeg
(74) Attorney, Agent, or Firm—Tran & Associates

(57) ABSTRACT

A facing targets sputtering device for semiconductor fabrication includes an air-tight chamber in which an inert gas is admittable and exhaustible; a pair of target plates placed at opposite ends of said air-tight chamber respectively so as to face each other and form a plasma region therebetween; a pair of magnets respectively disposed adjacent to said target plates such that magnet poles of different polarities face each other across said plasma region thereby to establish a magnetic field of said plasma region between said target plates; a substrate holder disposed adjacent to said plasma region, said substrate holder adapted to hold a substrate on which an alloyed thin film is to be deposited; and a back-bias power supply coupled to the substrate holder.

15 Claims, 7 Drawing Sheets

BACK-BIASED FACE TARGET SPUTTERING

BACKGROUND

The present invention relates to systems and methods for fabricating semiconductor devices at low temperature.

Various semiconductor fabrication steps need to be done at low temperature. For instance, when applying a ferroelectric thin film to a highly integrated device, conventional processes do not provide a ferroelectric thin film which sufficiently fulfills various conditions, such as denseness and evenness on the thin film surface required for fine processing and formation of film at a relatively low temperature.

U.S. Pat. No. 5,000,834 discloses a vacuum deposition technique known as face target sputtering to form thin films on magnetic recording heads at low temperature. The sputtering method is widely used for forming a thin film on a substrate made of PMMA because of intimacy between the substrate and the thin film formed therethrough. The amorphous thin film of rare earth—transition metal alloy formed through the sputtering method is applied to an erasable magneto-optical recording medium. The sputtering method is performed as follows: Positive ions of an inert gas such as Argon (Ar) first created by a glow discharge are accelerated toward a cathode or target, and then they impinge upon the target. As a result of ionic bombardment, neutral atoms and ions are removed from the target surface into a vacuum chamber due to the exchange of momentum therebetween. The liberated or sputtered atoms and ions are consequently deposited on a preselected substrate disposed in the vacuum chamber.

U.S. Pat. No. 6,156,172 discloses a plasma generating unit and a compact configuration of the combination of plasma space and substrate holders for a facing target type sputtering apparatus which includes: an arrangement for defining box-type plasma units supplied therein with sputtering gas mounted on outside wall-plates of a closed vacuum vessel; at least a pair of targets arranged to be spaced apart from and face one another within the box-type plasma unit, with each of the targets having a sputtering surface thereof; a framework for holding five planes of the targets or a pair of facing targets and three plate-like members providing the box-type plasma unit so as to define a predetermined space apart from the pair of facing targets and the plate-like members, which framework is capable of being removably mounted on the outside walls of the vacuum vessel with vacuum seals; a holder for the target having conduits for a coolant; an electric power source for the targets to cause sputtering from the surfaces of the targets; permanent magnets arranged around each of the pair of targets for generating at least a perpendicular magnetic field extending in a direction perpendicular to the sputtering surfaces of the facing targets; devices for containing the permanent magnets with target holders, removably mounted on the framework; and a substrate holder at a position adjacent the outlet space of the sputtering plasma unit in the vacuum vessel. The unified configuration composed of a cooling device for cooling both the backside plane of the targets and a container of magnets in connection with the framework improves the compactness of sputtering apparatus.

SUMMARY

In one aspect, a facing targets sputtering device for semiconductor fabrication includes an air-tight chamber in which an inert gas is admittable and exhaustible; a pair of target plates placed at opposite ends of said air-tight chamber respectively so as to face each other and form a plasma region therebetween; a pair of magnets respectively disposed adjacent to said target plates such that magnet poles of different polarities face each other across said plasma region thereby to establish a magnetic field of said plasma region between said target plates; a substrate holder disposed adjacent to said plasma region, said substrate holder adapted to hold a substrate on which an alloyed thin film is to be deposited; and a back-bias power supply coupled to the substrate holder.

In another aspect, a method for sputtering a thin film onto a substrate includes providing at least one target and a substrate having a film-forming surface portion and a back portion; creating a magnetic field so that the film-forming surface portion is placed in the magnetic field with the magnetic field induced normal to the substrate surface portion; back-biasing the back portion of the substrate; and sputtering material onto the film-forming surface portion.

Advantages of the invention may include one or more of the following. The substrate temperature in forming a thin film is approximately that of room temperature, and the process requires a short time. Since the thin film is formed at a very low temperature during substantially the whole process, the process can be applied to a highly integrated device to deposit an additional layer with a plurality of elements without damaging other elements previously deposited using conventional deposition.

BRIEF DESCRIPTION OF THE FIGURES

In order that the manner in which the above-recited and other advantages and features of the invention are obtained, a more particular description of the invention briefly described above will be rendered by reference to specific embodiments thereof, which are illustrated, in the appended drawings. Understanding that these drawings depict only typical embodiments of the invention and are not therefore to be considered to be limiting of its scope, the invention will be described and explained with additional specificity and detail through the use of the accompanying drawings in which.

DESCRIPTION

Figure 1:
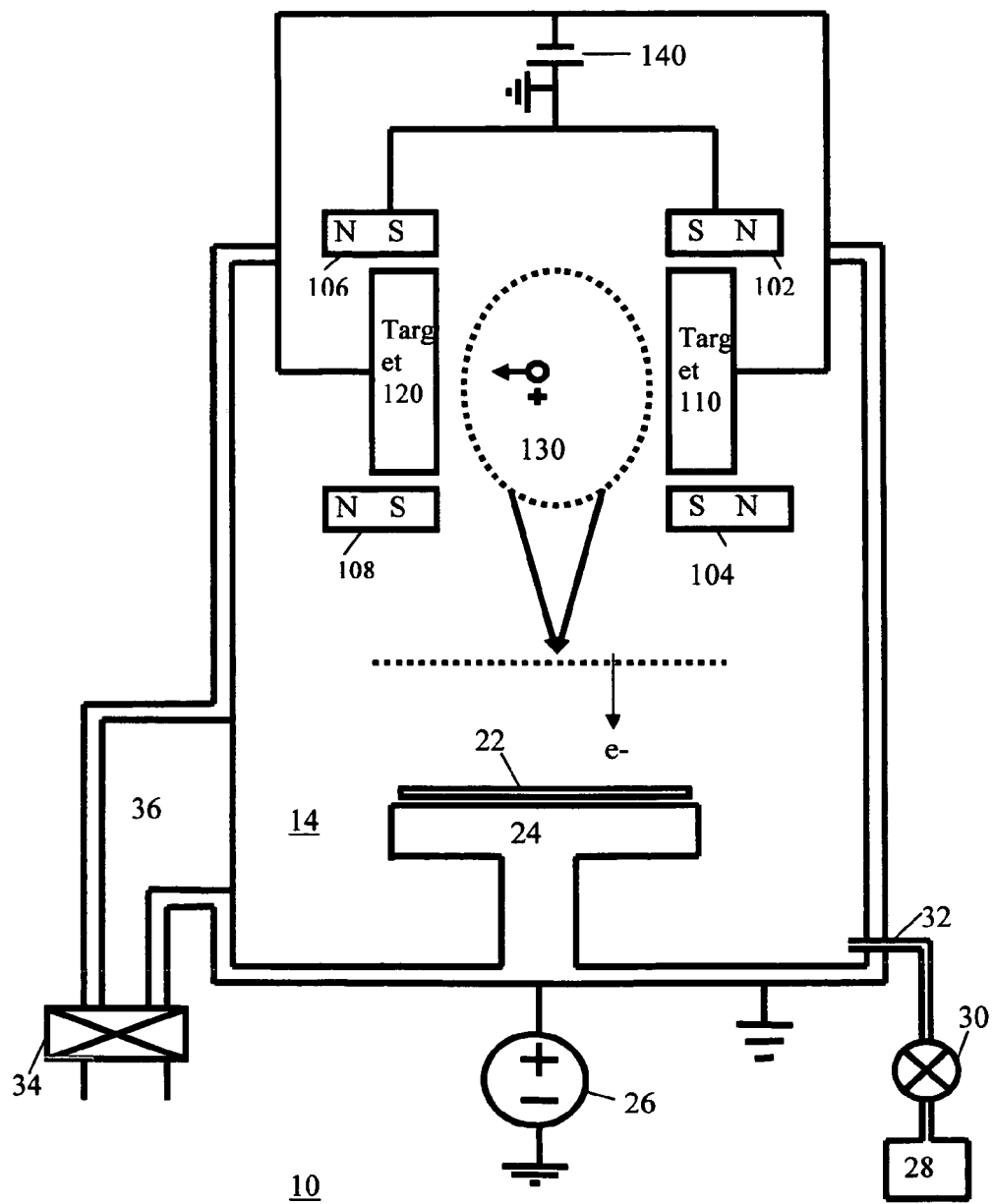
FIG. 1 shows one embodiment of an apparatus for fabricating semiconductor.

Referring now to the drawings in greater detail, there is illustrated therein structure diagrams for a semiconductor processing system and logic flow diagrams for processes a system will utilize to deposit a memory device at low temperature, as will be more readily understood from a study of the diagrams.

FIG. 1 shows one embodiment of an apparatus for fabricating semiconductor. An embodiment reactor 10 is schematically illustrated in FIG. 1. The reactor 10 includes a metal chamber 14 that is electrically grounded. A wafer or substrate 22 to be sputter coated is supported on a pedestal electrode 24 in opposition to the target 16. An electrical bias source 26 is connected to the pedestal electrode 24. Preferably, the bias source 26 is an RF bias source coupled to the pedestal electrode 24 through an isolation capacitor. Such bias source produces a negative DC self-bias VB on the pedestal electrode 24 on the order of tens of volts. A working gas such as argon is supplied from a gas source 28 through a mass flow controller 30 and thence through a gas inlet 32 into the chamber. A vacuum pump system 34 pumps the chamber through a pumping port 36.

An FTS unit is positioned to face the wafer 22 and has a plurality of magnets 102, 104, 106, and 108. A first target 110 is positioned between magnets 102 and 104, while a second target 120 is positioned between magnets 106 and 108. The first and second targets 110 and 120 define an electron confining region 130. A power supply 140 is connected to the magnets 102–108 and targets 110–120 so that positive charges are attracted to the second target 120. During operation, particles are sputtered onto a substrate 22 which, in one embodiment where the targets 110 and 120 are laterally positioned, is vertically positioned relative to the lateral targets 110 and 120. The substrate 22 is arranged to be perpendicular to the planes of the targets 110 and 120. A substrate holder 24 supports the substrate 22.

The targets 110 and 120 are positioned in the reactor 10 in such a manner that two rectangular shape cathode targets face each other so as to define the plasma confining region 130 therebetween. Magnetic fields are then generated to cover vertically the outside of the space between facing target planes by the arrangement of magnets installed in touch with the backside planes of facing targets 110 and 120. The facing targets 110 and 120 are used as a cathode, and the shield plates are used as an anode, and the cathode/anode are connected to output terminals of the direct current (DC) power supply 140. The vacuum vessel and the shield plates are also connected to the anode.

Under pressure, sputtering plasma is formed in the space 130 between the facing targets 110 and 120 while power from the power source is applied. Since magnetic fields are generated around the peripheral area extending in a direction perpendicular to the surfaces of facing targets 110 and 120, highly energized electrons sputtered from surfaces of the facing targets 110 and 120 are confined in the space between facing targets 110 and 120 to cause increased ionized gases by collision in the space 130. The ionization rate of the sputtering gases corresponds to the deposition rate of thin films on the substrate 22, then, high rate deposition is realized due to the confinement of electrons in the space 130 between the facing targets. The substrate 22 is arranged so as to be isolated from the plasma space between the facing targets 110 and 120.

Film deposition on the substrate 22 is processed at a low temperature range due to a very small number of impingement of plasma from the plasma space and small amount of thermal radiation from the target planes. A typical facing target type of sputtering method has superior properties of depositing ferromagnetic materials at high rate deposition and low substrate temperature in comparison with a magnetron sputtering method. When sufficient target voltage VT is applied, plasma is excited from the argon. The chamber enclosure is grounded. The RF power supply 26 to the chuck or pedestal 24 causes an effective DC 'back-bias' between the wafer and the chamber. This bias is negative, so it repels the low-velocity electrons.

Figure 2:
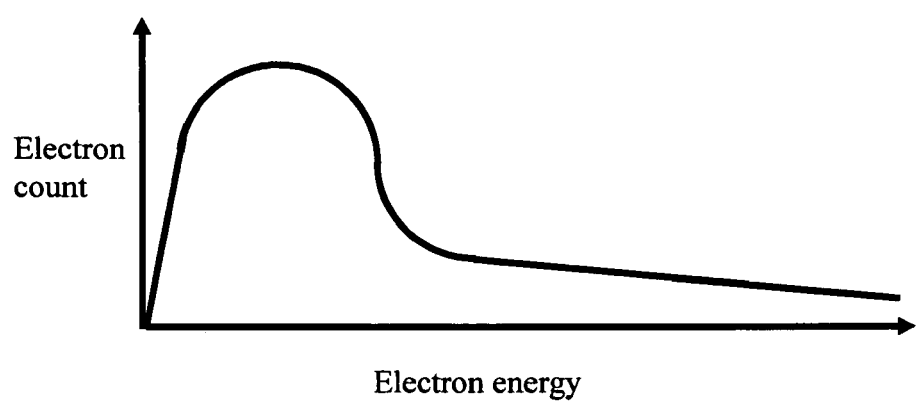
FIG. 2 is an exemplary electron distribution chart.

FIG. 2 illustrates an exemplary electron distribution for the apparatus of FIG. 1. The electron distribution follows a standard Maxwellian curve. Low energy electrons have two characteristics: they are numerous and they tend to have non-elastic collisions with the deposited atoms, resulting in amorphization during deposition. High-energy electrons come through the back-biased shield, but they effectively "bounce" off the atoms without significant energy transfer—these electrons do not affect the way bonds are formed. This is especially true because high energy electrons spend very little time in the vicinity of the atoms, while the low energy electrons spend more time next to the atoms and can interfere with bond formation.

The presence of the large positively biased shield affects the plasma, particularly the plasma close to the pedestal electrode 24. As a result, the DC self-bias developed on the pedestal 24, particularly by an RF bias source, may be more positive than that for the conventional large grounded shield, that is, less negative since the DC self-bias is negative in typical applications. It is believed that the change in DC self-bias arises from the fact that the positively biased shield drains electrons from the plasma, thereby causing the plasma and hence the pedestal electrode to become more positive.

Figure 3:
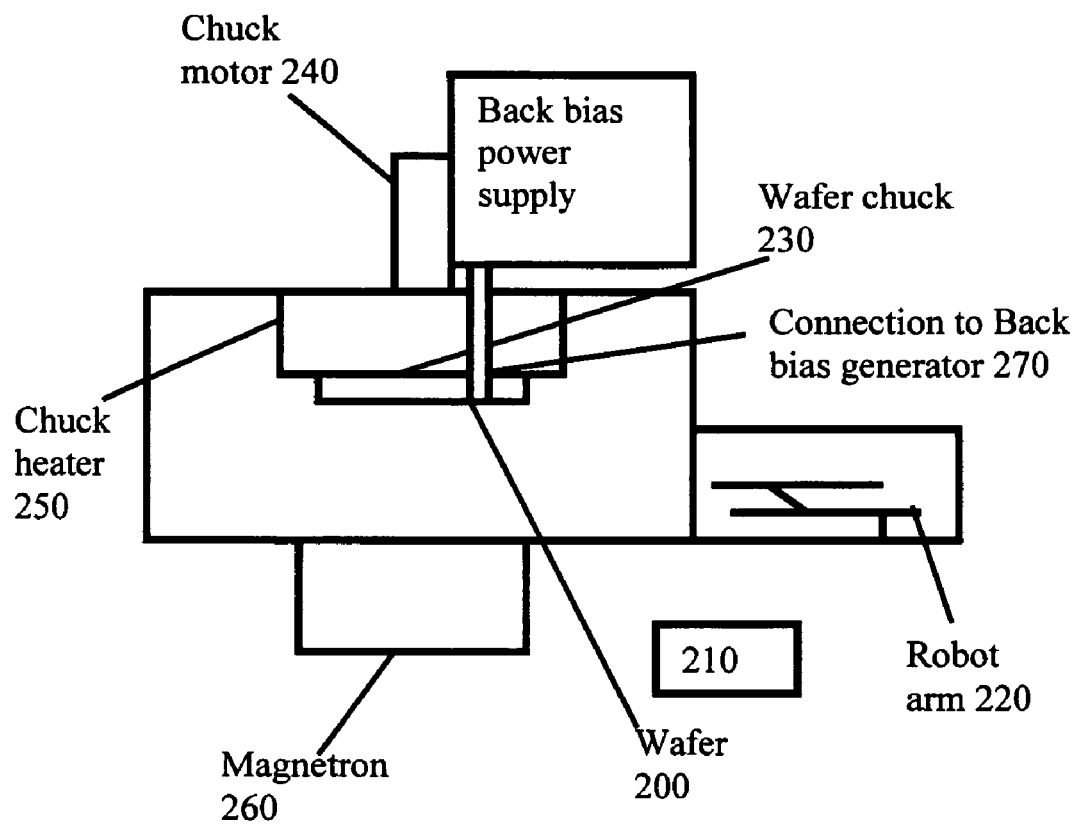
FIG. 3 shows one embodiment of an FTS unit.

FIG. 3 shows another embodiment of an FTS system. In this embodiment, a wafer 200 is positioned in a chamber 210. The wafer 200 is moved into the chamber 210 using a robot arm 220. The robot arm 220 places the wafer 200 on a wafer chuck 230. The wafer chuck 230 is moved by a chuck motor 240. One or more chuck heaters 250 heats the wafer 200 during processing.

Additionally, the wafer 200 is positioned between the heater 250 and a magnetron 260. The magnetron 260 serves as highly efficient sources of microwave energy. In one embodiment, microwave magnetrons employ a constant magnetic field to produce a rotating electron space charge. The space charge interacts with a plurality of microwave resonant cavities to generate microwave radiation. One electrical node 270 is provided to a back-bias generator such as the generator 26 of FIG. 1.

In the system of FIG. 3, two target plates are respectively connected and disposed onto two target holders which are fixed to both inner ends of the chamber 210 so as to make the target plates face each other. A pair of permanent magnets are accommodated in the target holders so as to create a magnetic field therebetween substantially perpendicular to the surface of the target plates. The wafer 200 is disposed closely to the magnetic field (which will define a plasma region) so as to preferably face it. The electrons emitted from the both target plates by applying the voltage are confined between the target plates because of the magnetic field to promote the ionization of the inert gas so as to form a plasma region. The positive ions of the inert gas existing in the plasma region are accelerated toward the target plates. The bombardment of the target plates by the accelerated particles of the inert gas and ions thereof causes atoms of the material forming the plates to be emitted. The wafer 200 on which the thin film is to be disposed is placed around the plasma region, so that the bombardment of these high energy particles and ions against the thin film plane is avoided because of effective confinement of the plasma region by the magnetic field. The back-bias RF power supply causes an effective DC 'back-bias' between the wafer 200 and the chamber 210. This bias is negative, so it repels the low-velocity electrons.

Figure 4A:
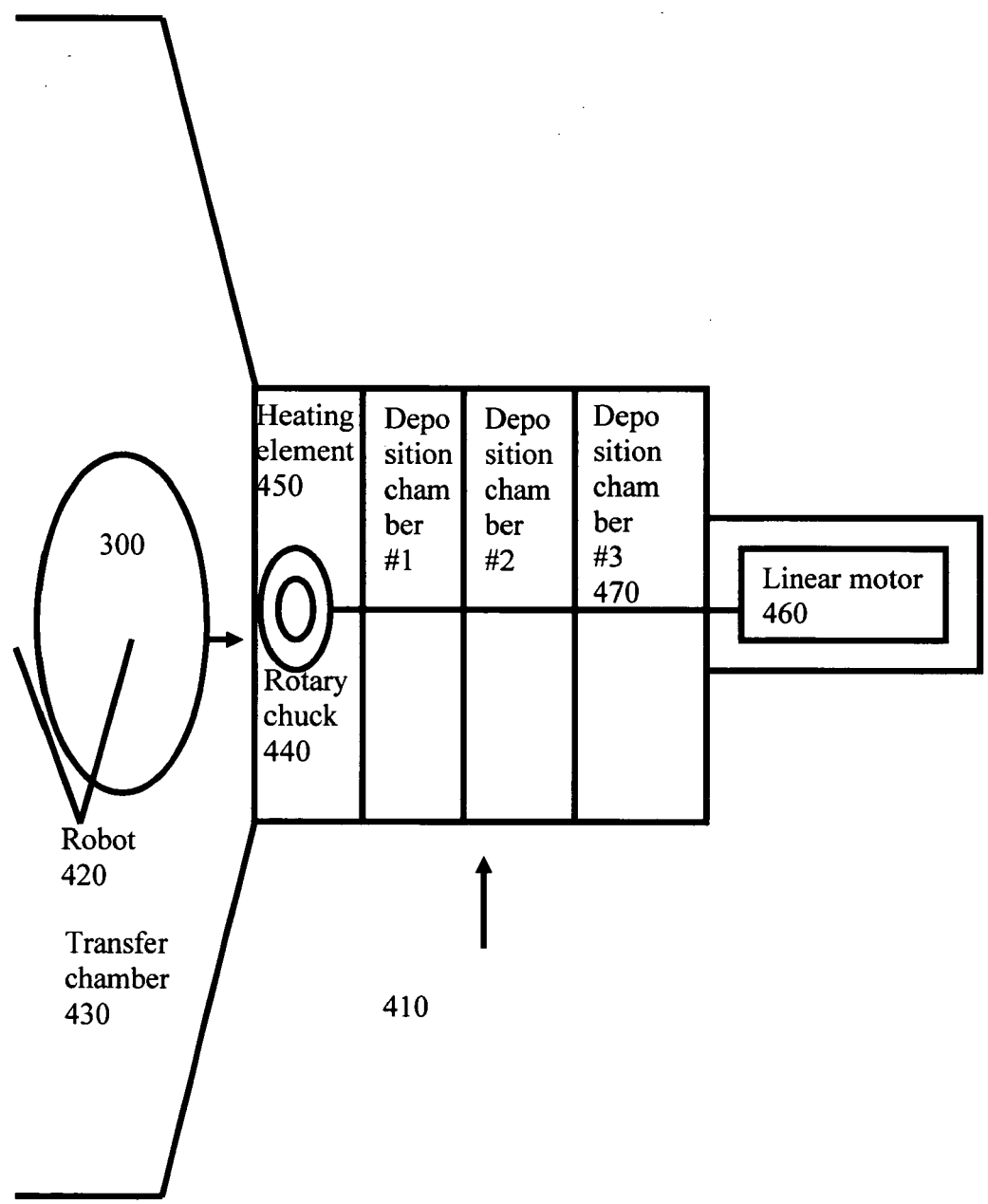
FIG. 4A shows one embodiment of a second apparatus for fabricating semiconductor.

FIG. 4A shows one embodiment of a second apparatus for fabricating semiconductor. In the system of FIG. 4A, multiple 1-D deposition sources are stacked in the deposition chamber. The stacking of the sources reduces the amount of wafer travel, while significantly increasing deposition uniformity. A wafer 300 is inserted into a chamber 410 using a robot arm 420 moving through a transfer chamber 430. The wafer 300 is positioned onto a rotary chuck 440 with chuck heater(s) 450 positioned above the wafer. A linear motor 460 moves the chuck through a plurality of deposition chambers 470.

The system of FIG. 4A provides a plurality of one dimensional sputter deposition chambers. Each chamber can deposit a line of material. By moving the wafer 300 with the linear motor 460, 2-d coverage is obtained.

Figure 4B:
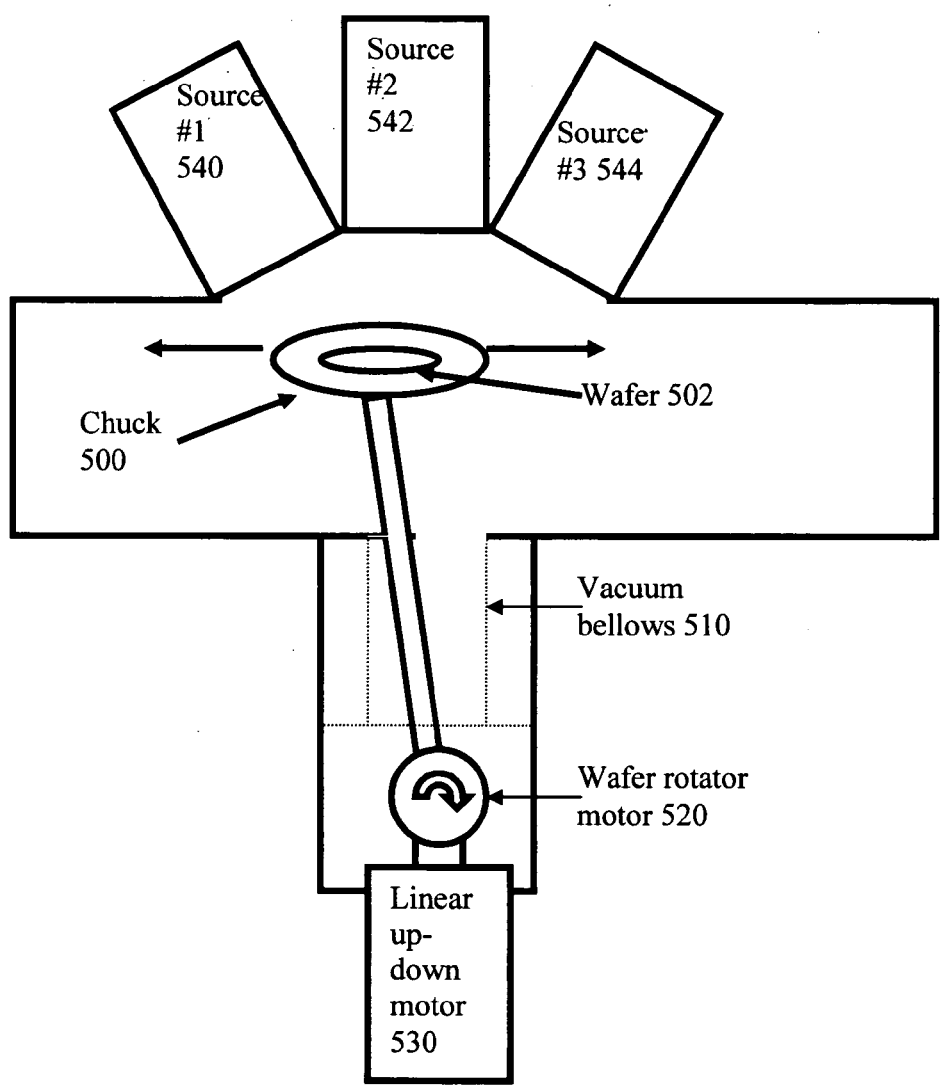
FIG. 4B shows one embodiment of a second apparatus for fabricating semiconductor.

Turning now to FIG. 4B, a second embodiment of a fabrication apparatus is shown. In this embodiment, a chuck 500 is positioned inside a chamber. The chuck 500 supports a wafer 502. The chamber has vacuum bellows 510. The chuck 500 is driven by a wafer rotator 520 which rotates the wafer 502 and the chuck 500 in a pendulum-like manner. The chuck 500 is also powered by a linear motor 530 to provide up/down motion. A plurality of sources 540, 542 and 544 perform deposition of materials on the wafer 502.

The system of FIG. 4B gets linear motion of the wafer 502 past the three sources for uniform deposition. This is done through a chuck supported from underneath rather than from the side. A jointed pendulum supports the wafer and keeps the wafer at a constant vertical distance from the target as the pendulum swings. The system swings the wafer using a pendulum. The system is more stable than a system with a lateral linear arm since the chuck 500 is heavy and supports the weight of the wafer, a heater, and RF back-bias circuitry and would require a very thick support arm otherwise the arm would wobble. Also, the linear arm would need to extend away from the source, resulting in large equipment. In this implementation, the arm sits below the chuck, resulting in a smaller piece of equipment and also the arm does not have to support much weight.

In one embodiment, a process for obtain 2D deposition coverage is as follows:

Receive desired 2D pattern from user

Move chuck into a selected deposition chamber;

Actuate linear motor and rotary chuck to in accordance with the 2D pattern

Move current wafer to next deposition chamber

Get next wafer into the current chamber and repeat process.

Figure 5:
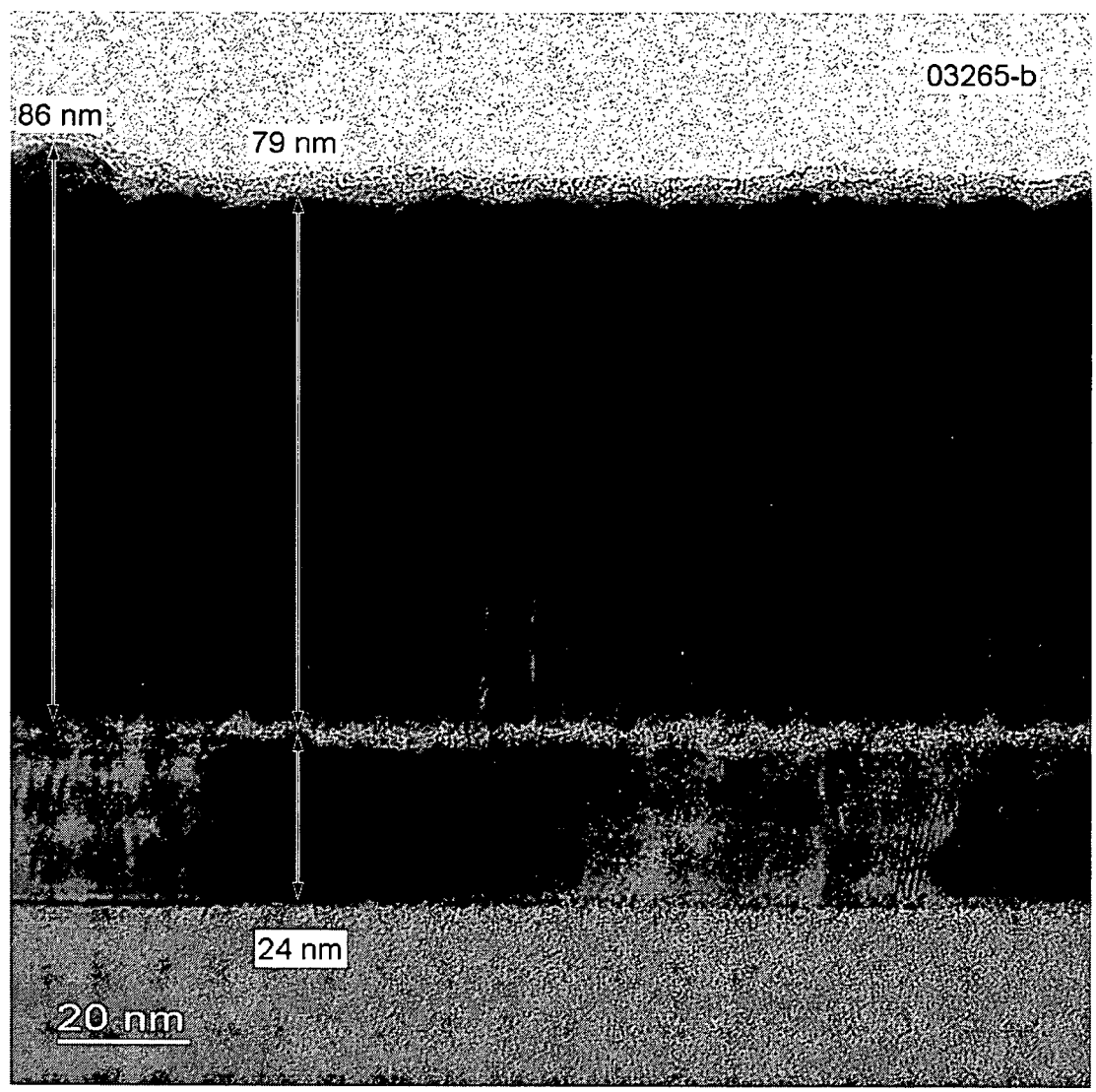
FIG. 5 shows an SEM image of a cross sectional view of an exemplary device fabricated with the system of FIG. 1.
Figure 6:
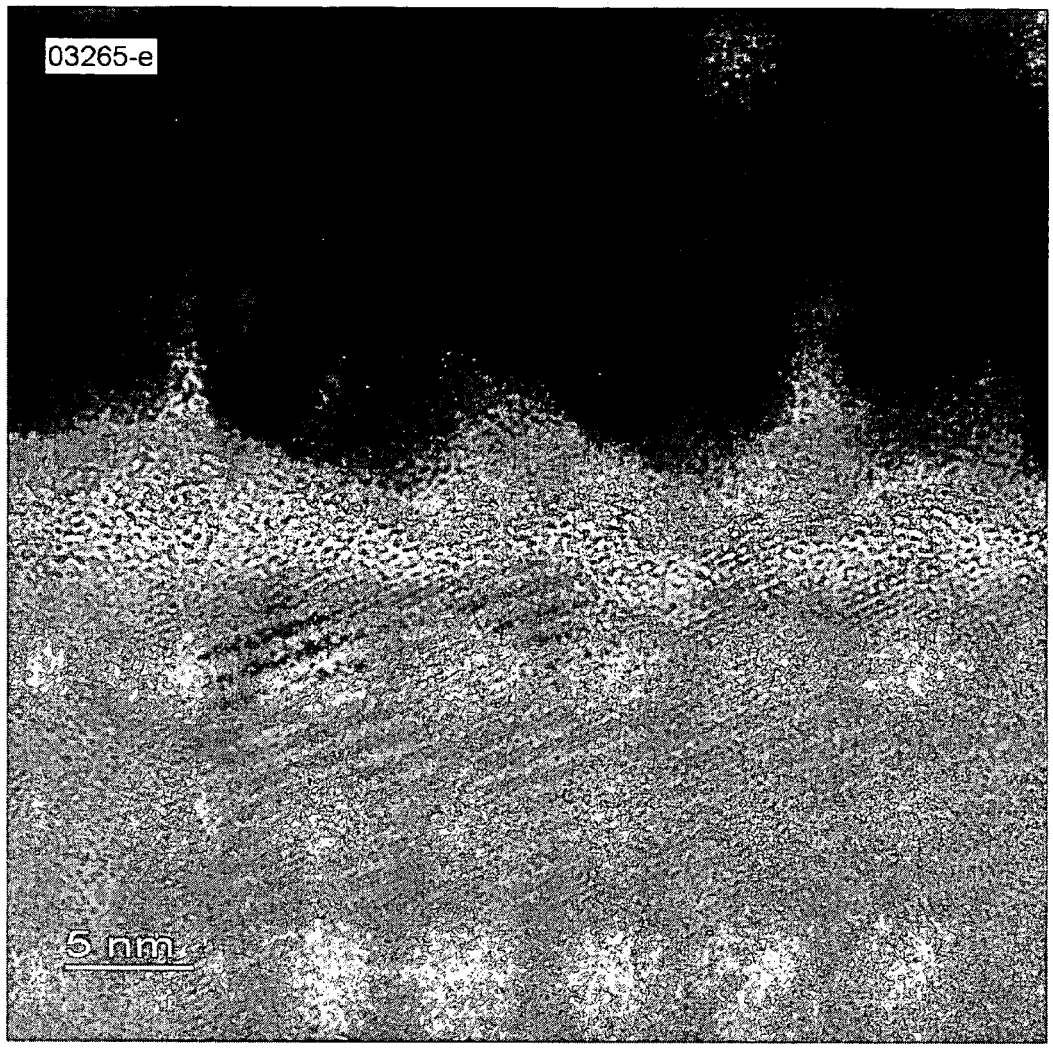
FIG. 6 is an enlarged view of one portion of the SEM image of FIG. 5.

FIG. 5 shows an SEM image of an exemplary device fabricated with the system of FIG. 1, while FIG. 6 is an enlarged view of one portion of the SEM image of FIG. 5. The device of FIG. 5 was fabricated at a low temperature (below 400° C.). At the bottom of FIG. 5 is an oxide layer (20 nm thick). Above the oxide layer is a metal layer, in this case a titanium layer (24 nm thick). Above this layer is an interface layer, in this case a platinum (Pt) interface face layer (about 5 nm). Finally, a crystallite PCMO layer (79 nm thick) is formed at the top. Grains in this layer can be seen extending from the bottom toward the top with a slightly angled tilt. FIG. 6 shows a zoomed view showing the Ti metal layer, the Pt interface layer and the PCMO grain in more details.

Although one back-biased power supply is mentioned, a plurality of back-bias power supplies can be used. These power supplies can be controllable independently from each other. The electric energies supplied can be independently controlled. Therefore, the components of the thin film to be formed are easily controlled in every sputtering batch process. In addition, the composition of the thin film can be changed in the direction of the thickness of the film by using the Facing Targets Sputtering device.

It is to be understood that various terms employed in the description herein are interchangeable. Accordingly, the above description of the invention is illustrative and not limiting. Further modifications will be apparent to one of ordinary skill in the art in light of this disclosure.

The invention has been described in terms of specific examples which are illustrative only and are not to be construed as limiting. The invention may be implemented in digital electronic circuitry or in computer hardware, firmware, software, or in combinations of them.

Apparatus of the invention for controlling the fabrication equipment may be implemented in a computer program product tangibly embodied in a machine-readable storage device for execution by a computer processor; and method steps of the invention may be performed by a computer processor executing a program to perform functions of the invention by operating on input data and generating output. Suitable processors include, by way of example, both general and special purpose microprocessors. Storage devices suitable for tangibly embodying computer program instructions include all forms of non-volatile memory including, but not limited to: semiconductor memory devices such as EPROM, EEPROM, and flash devices; magnetic disks (fixed, floppy, and removable); other magnetic media such as tape; optical media such as CD-ROM disks; and magneto-optic devices. Any of the foregoing may be supplemented by, or incorporated in, specially-designed application-specific integrated circuits (ASICs) or suitably programmed field programmable gate arrays (FPGAs).

While the preferred forms of the invention have been shown in the drawings and described herein, the invention should not be construed as limited to the specific forms shown and described since variations of the preferred forms will be apparent to those skilled in the art. Thus the scope of the invention is defined by the following claims and their equivalents.

What is claimed is:

1. A facing targets sputtering device for semiconductor fabrication, comprising:

an air-tight chamber in which an inert gas is admittable and exhaustible;

a pair of target plates placed at opposite ends of said air-tight chamber respectively so as to face each other and form a plasma region therebetween;

a pair of magnets respectively disposed adjacent to said target plates such that magnet poles of different polarities face each other across said plasma region thereby to establish a magnetic field of said plasma region between said target plates;

a substrate holder disposed adjacent to said plasma region, said substrate holder adapted to hold a substrate on which an alloyed tin film is to be deposited;

a first target power supply coupled to one of the target plates;

a chuck heater mounted above the wafer; and a back-bias power supply coupled to the substrate holder.

2. A facing targets sputtering device according to claim 1, wherein the back-bias power supply is a DC or an AC electric power source.

3. A facing targets sputtering device according to claim 1, wherein the first target power supply is a DC or an AC electric power source.

4. A facing targets sputtering device according to claim 1, further comprising a second target power supply coupled to one of the target plates.

5. A facing targets sputtering device according to claim 4, wherein the first and second target power supplies comprises DC and AC electric power sources.

6. A facing targets sputtering device according to claim 1, further comprising a robot arm to move the wafer.

7. A facing targets sputtering device according to claim 1, further comprising a magnetron coupled to the chamber.

8. The facing targets sputtering device of claim 1, comprising first and second targets mounted in parallel.

9. The facing targets sputtering device of claim 8, further comprising magnets positioned between the first and second targets.

10. The facing targets sputtering device of claim 8, further comprising a power supply coupled to the magnets and the targets.

11. The facing targets sputtering device of claim 8, wherein the substrate is positioned perpendicularly to the planes of the targets.

12. The facing targets sputtering device of claim 1, wherein the substrate comprises a semiconductor layer.

13. A method for sputtering a thin film onto a substrate, comprising:
    providing at least one target and a substrate having a film-forming surface portion and a back portion;
    creating a magnetic field so that the film-forming surface portion is placed in the magnetic field with the magnetic field induced normal to the substrate surface portion
    back-biasing the back portion of the substrate;
    swinging the wafer using a pendulum;
    providing a pair of said targets opposed to each other where the substrate is disposed between the targets; and
    sputtering material onto the film-forming surface portion.

14. A method as in claim 13, further comprising supporting a chuck from underneath rather than side-way.

15. A method as in claim 13, further comprising providing a plurality of sources to deposit materials onto the substrate.

* * * * *